(12) United States Patent
Gajapathy

(10) Patent No.: US 10,373,672 B2
(45) Date of Patent: Aug. 6, 2019

(54) COMMAND SIGNAL CLOCK GATING

(71) Applicant: Micron Technology, Inc., Boise, ID (US)

(72) Inventor: Parthasarathy Gajapathy, Highland Village, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/039,995

(22) Filed: Jul. 19, 2018

(65) Prior Publication Data

US 2019/0066758 A1    Feb. 28, 2019

Related U.S. Application Data

(63) Continuation of application No. 15/693,194, filed on Aug. 31, 2017, now Pat. No. 10,163,486.

(51) Int. Cl.

| G11C 8/18 | (2006.01) |
|---|---|
| G11C 11/4076 | (2006.01) |
| G11C 11/408 | (2006.01) |
| G11C 7/10 | (2006.01) |
| G11C 8/06 | (2006.01) |
| G11C 11/4093 | (2006.01) |
| G11C 8/16 | (2006.01) |

(52) U.S. Cl.
CPC ......... *G11C 11/4076* (2013.01); *G11C 7/109* (2013.01); *G11C 7/1093* (2013.01); *G11C 8/06* (2013.01); *G11C 11/408* (2013.01); *G11C 11/4093* (2013.01); *G11C 8/16* (2013.01); *G11C 8/18* (2013.01)

(58) Field of Classification Search
CPC ........................................................ G11C 8/18
USPC .................................................... 365/233.13
See application file for complete search history.

(56) References Cited

U.S. PATENT DOCUMENTS

| 3,894,246 | A | 7/1975 | Torgrim |
|---|---|---|---|
| 6,137,744 | A | 10/2000 | Watanabe |
| 7,609,584 | B2 * | 10/2009 | Kim ..................... G11C 7/1027 365/194 |
| 7,668,038 | B2 | 2/2010 | Kim |
| 7,742,551 | B2 | 6/2010 | Pyeon |
| 9,979,381 | B1 | 5/2018 | Rasouli et al. |
| 10,163,486 | B1 * | 12/2018 | Gajapathy ........... G11C 11/4076 |
| 2008/0301603 | A1 | 12/2008 | Yee et al. |
| 2014/0226395 | A1 | 8/2014 | Vilangudipitchai et al. |
| 2015/0179248 | A1 | 6/2015 | Patil et al. |
| 2017/0024273 | A1 | 1/2017 | Han et al. |
| 2017/0244392 | A1 | 8/2017 | Stevens et al. |

OTHER PUBLICATIONS

PCT International Search Report & Written Opinion for PCT Application No. PCT/US2018/029139 dated Aug. 14, 2018; 5 Pages.

* cited by examiner

*Primary Examiner* — Son L Mai
(74) *Attorney, Agent, or Firm* — Fletcher Yoder, P.C.

(57) ABSTRACT

A semiconductor device includes a clock gating tree comprising a first clock gating stage and a second clock gating stage. The first clock gating stage is configured to receive an activate detection signal and to activate clocking events in the second clock gating stage in response to the activate detection signal. The clocking events are not activated in the absence of the activate detection signal.

6 Claims, 5 Drawing Sheets

COMMAND SIGNAL CLOCK GATING

CROSS REFERENCE TO RELATED APPLICATIONS

This application is a Continuation and claims priority to U.S. patent application Ser. No. 15/693,194, filed Aug. 31, 2017, which is herein incorporated by reference.

BACKGROUND

Field of the Present Disclosure

Embodiments of the present disclosure relate generally to the field of semiconductor devices. More specifically, embodiments of the present disclosure relate to clock gating for signals.

Description of Related Art

A semiconductor device, such as a microcomputer, memory, gate array, among others, may include command paths to transmit commands from a command source, such as an input pin, register, controller, and the like, to logic in the semiconductor device configured to implement the command. The command paths may include synchronous digital circuits that may be used in the semiconductor device to facilitate implementing the command. In a synchronous digital logic circuit, command data or signals are stored in memory elements, such as flip-flops, and changes in the states (e.g., toggling) of the memory elements are synchronized by a clock gating cell with logic gate(s) to generate a clock signal. For example, the output of a flip-flop is constant until a pulse is applied to its clock input, upon which the data at the input of the flip-flop is latched to its output.

However, each clocking and switching event of the flip-flops may consume power. Although clock gating techniques may help to reduce power consumption, these techniques frequently implement complex clock distribution networks or clock trees having a number of logic gates to distribute clock signals to the flip-flops. However, the increased complexity in distribution networks or clock trees that may help to reduce power consumption may also lead to challenges in design implementation. Further, clock latency for each flip-flop may add constraints on improving speed of the semiconductor device. Accordingly, embodiments of the present disclosure may be directed to one or more of the problems set forth above.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As described in detail below, a synchronous digital circuit is provided to more efficiently provide clock gating of the command address signals received by the semiconductor device, such as a memory device. The synchronous digital circuit includes a clock tree for command signal clock gating. Each clock gating tree includes a first clock gating stage and a second clock gating stage. In accordance with the embodiments described herein, the first clock gating stage may include a simplified scheme that advantageously minimizes the number of elements in the design of the clock gating tree. Further, the present design reduces power consumption by the clock gating tree by reducing the clocking of the elements in the second clock gating stage by designing the clock gating tree such that the second clock gating stage is not activated on every clock cycle. Instead, the second clock gating stage may be activated upon the detection of an activate signal. In addition, the overall timing of the clock gating tree is simplified by embodiments of the present design, based on a reduction in complexity and the arrangement of elements of the clock gating tree.

Figure 1:
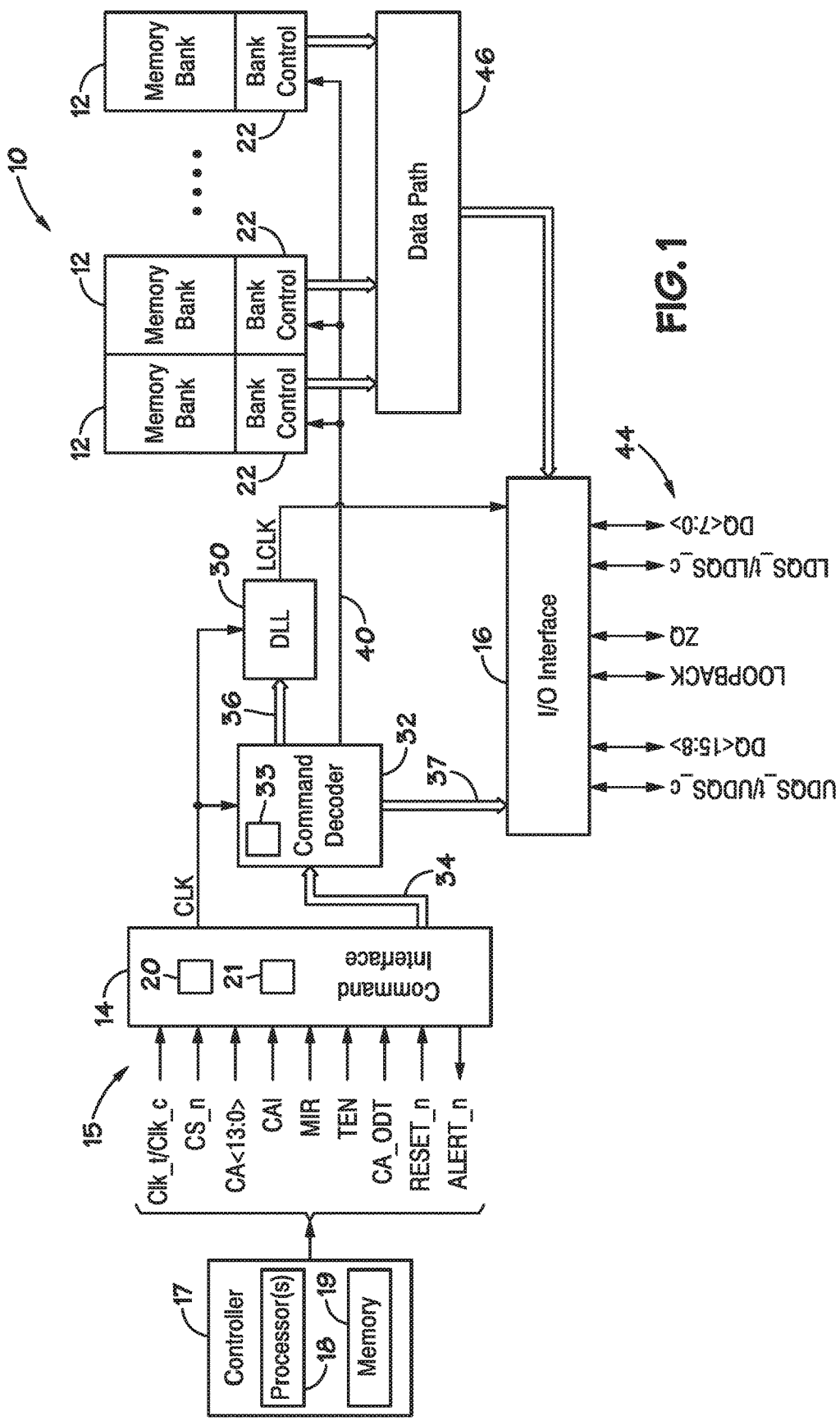
FIG. 1 is a simplified block diagram illustrating certain features of a memory device, according to an embodiment of the present disclosure.

Turning now to the figures, FIG. 1 is a simplified block diagram illustrating certain features of a semiconductor device 10 (e.g., a memory device), according to an embodiment of the present disclosure. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth and more storage capacity compared to prior generations of DDR SDRAM. While the present disclosure uses the memory device 10 as an example, it should be understood that embodiments of the present disclosure are envisioned to apply to any suitable semiconductor device, such as integrated circuits, transistors, processors, microprocessors, and the like.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabit (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16. The command interface 14 may include processing and/or interface circuitry configured to provide a number of signals (e.g., signals 15) from an external device, such as a controller 17. The controller 17 may include processing circuitry, such as one or more processors 18 (e.g., one or more microprocessors), that may execute software programs to, for example, provide various signals 15 to the memory device 10 to facilitate the transmission and receipt of data to be written to or read from the memory device 10. Moreover, the processor(s) 18 may include multiple microprocessors, one or more "general-purpose" microprocessors, one or more special-purpose microprocessors, and/or one or more application specific integrated circuits (ASICS), or some combination thereof. For example, the processor(s) 18 may include one or more reduced instruction set (RISC) processors. The controller 17 may couple to one or more memories 19 that may store information such as control logic and/or software, look up tables, configuration data, etc. In some embodiments, the processor(s) 18 and/or the memory 19 may be external to the controller 17. The memory 19 may include a tangible, non-transitory, machine-readable-medium, such as a volatile memory (e.g., a random access memory (RAM)) and/or a nonvolatile memory (e.g., a read-only memory (ROM), flash memory, a hard drive, or any other suitable optical, magnetic, or solid-state storage medium, or a combination thereof). The memory 19 may store a variety of information and may be used for various purposes. For example, the memory 19 may store machine-readable and/or processor-executable instructions (e.g., firmware or software) for the processor(s) 18 to execute, such as instructions for providing various signals 15 to the memory device 10 to facilitate the transmission and receipt of data to be written to or read from the memory device 10. As such, the controller 17 may provide various signals 15 to the memory device 10 to facilitate the transmission and receipt of data to be written to or read from the memory device 10.

As will be appreciated, the command interface 14 may include a number of circuits, such as a clock input circuit 20 and a command address input circuit 21, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t) and the complementary clock signal (Clk_c). The positive clock edge for DDR refers to the point where the rising true clock signal Clk_t crosses the falling complementary clock signal Clk_c, while the negative clock edge indicates that transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges.

The I/O interface 16 may include processing and/or interface circuitry configured to manage and/or perform input/output operations between the memory device 10 and any suitable external device coupled to the I/O interface 16. The clock input circuit 20 receives the true clock signal (Clk_t) and the complementary clock signal (Clk_c) and generates an internal clock signal CLK. The internal clock signal CLK is supplied to an internal clock generator 30, such as a delay locked loop (DLL) circuit. The internal clock generator 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the internal clock generator 30 over the bus 36 to coordinate generation of the phase controlled internal clock signal LCLK. The command decoder 32 may also provide command signals to the I/O interface 16 over bus 37 to facilitate receiving and transmitting I/O signals. The phase controlled internal clock signal LCLK may be used to clock data through the IO interface 16, for instance. Further, the command decoder 32 may decode commands, such as read commands, write commands, mode-register set commands, activate commands, etc., and provide access to a particular memory bank 12 corresponding to the command, via the bus path 40. As will be appreciated, the command decoder 32 may include components, such as a synchronous digital circuit 33 coupled to the command bus 34 to facilitate synchronized flow of signals and/or logical operations performed on those signals.

As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12. The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t/and Clk_c). The command interface may include a command address input circuit 21 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the TO interface 16. More specifically, the data may be sent to or retrieved from the memory banks 12 over the data path 46, which may include multiple data paths or bi-directional data buses. Data TO signals, generally referred to as DQ signals, are generally transmitted and received in one or more bi-directional data busses. For certain memory devices, such as a DDR5 SDRAM memory device, the TO signals may be divided into upper and lower bytes. For instance, for a x16 memory device, the TO signals may be divided into upper and lower TO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t/and Clk_c), the data strobe (DQS) signals may be provided as a differential pair of data strobe signals (DQS_t/and DQS_c) to provide differential pair signaling during reads and writes. For certain memory devices, such as a DDR5 SDRAM memory device, the differential pairs of DQS signals may be divided into upper and lower data strobe signals (e.g., UDQS_t/and UDQS_c; LDQS_t/and LDQS_c) corresponding to upper and lower bytes of data sent to and from the memory device 10, for instance.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the TO interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory system 10. Accordingly, it should be understood that the block diagram of FIG. 1 is only provided to highlight certain functional features of the memory device 10 to aid in the subsequent detailed description.

Figure 2A:
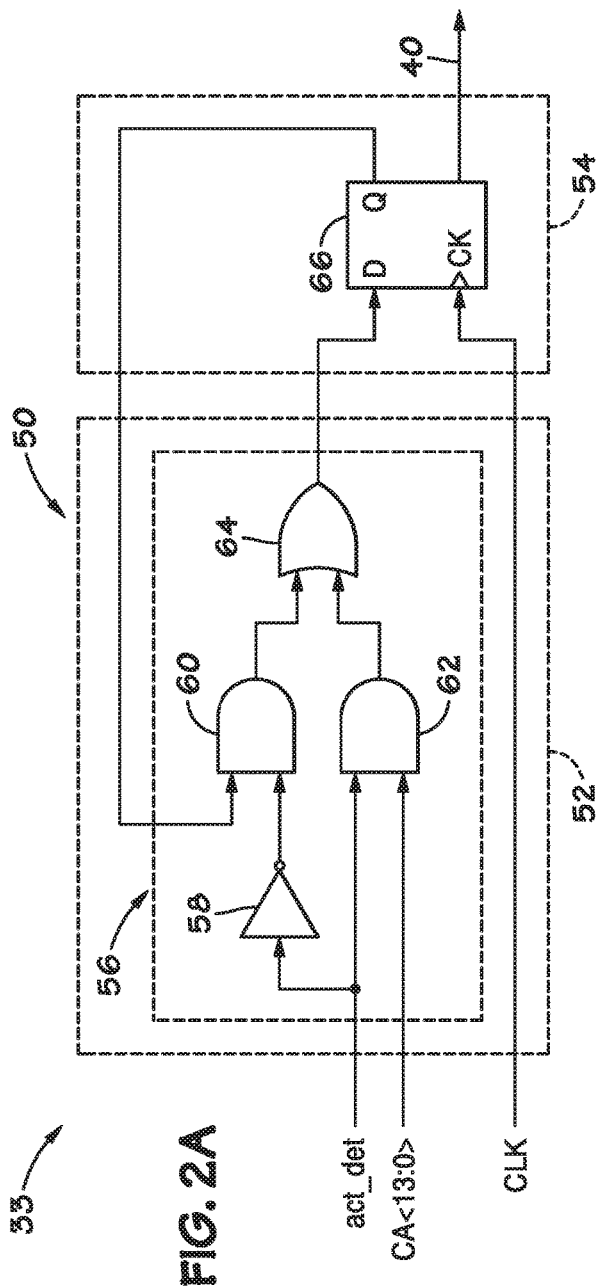
FIG. 2A is an example block diagram of a synchronous digital circuit in a command decoder of the memory device of FIG. 1, illustrating a clock gating tree, according to an embodiment of the present disclosure.
Figure 2B:
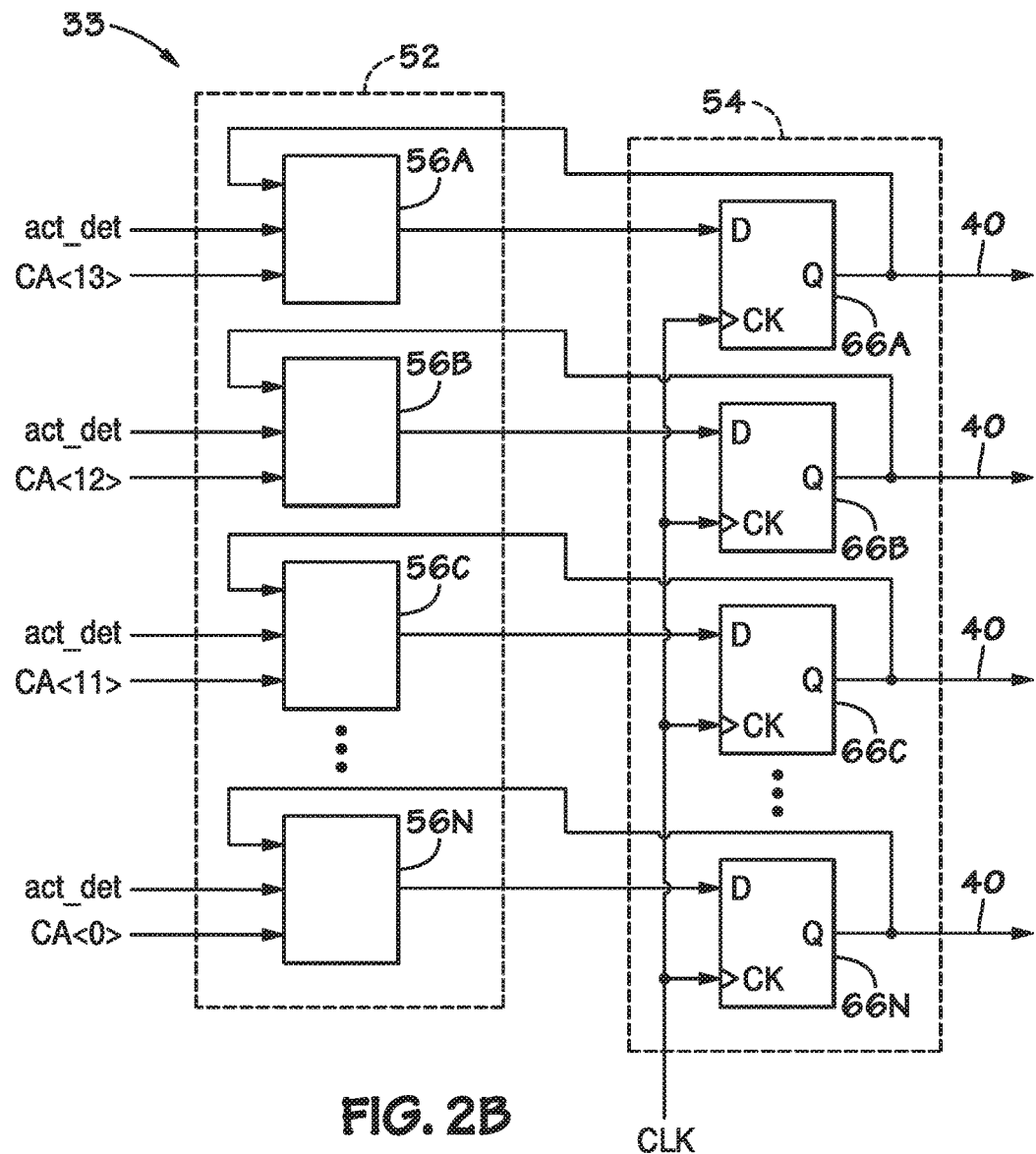
FIG. 2B is a more detailed representation of the clock gating tree of FIG. 2A, accordingly to an embodiment of the present disclosure.

As set forth above, the command decoder 32 may include the synchronous digital circuit 33 coupled to the command bus 34 to facilitate synchronized flow of signals and the logical operations performed on those signals. FIG. 2A is an example block diagram of the synchronous digital circuit 33 in a simplified representation. The synchronous digital circuit 33 may include a clock gating tree 50 for command signal clock gating. The clock gating tree 50 may include a first clock gating stage 52 and a second clock gating stage 54. The first clock gating stage 52 may include fourteen logic gate circuits 56, and each of the fourteen logic gate circuits 56 may include one or more logic gates, such as an invertor 58, AND gates 60 and 62, and an OR gate 64. The second clock gating stage 54 may include fourteen flip-flops 66. Each of the fourteen flip-flops 66 may include an input pin D, an output pin Q, and a clock pin CK. A more detailed representation of the clock gating tree 50 is shown in FIG. 2B. As illustrated, the first clock gating stage 52 includes fourteen logic gate circuits 56A, 56B, 56C . . . , and 56N (collectively, "logic gate circuits 56") and the second clock gating stage 54 includes fourteen flip-flops 66A, 66B, 66C . . . , and 66N (collectively, "logic gate circuits 66"). Note that each signal line in FIG. 2B represents a 1-bit bus.

Each of the logic gate circuits 56 may receive an input signal (e.g., one of the fourteen command/address signals, CA<13:0>). As illustrated, the logic gate circuit 56A may receive the command/address signal CA<13>, the logic gate circuit 56B may receive the command/address signal CA<12>, the logic gate circuit 56B may receive the command/address signal CA<11>, and so forth. Each of the logic gate circuits 56 may also receive an output signal looped back from the output pin Q of the corresponding flip-flop 66 and an activate detection signal (e.g., act_det). In response to receiving the activate detection (e.g., act_det), each of the logic gate circuits 56 processes the input signals through the one or more logic gates (e.g., the invertor 58, the AND gates 60 and 62, and the OR gate 64) to output a signal to the input pin D of the the corresponding flip-flop 66 in each of the fourteen signal paths through the clock gating tree 50. Based on the internal clock signal (CLK) received by the clock pin CK, each of the flip-flops 66 is clocked on every clock cycle to latch the signal output by the corresponding logic gate circuit 56 to the output Q of the corresponding flip-flop 66. As such, all fourteen of the logic gate circuits 56 of the first clock gating stage 52 continuously operate and all fourteen of the flip-flops 66 are clocked and latched on every clock cycle. As may be appreciated, the clock gating tree 50 may be designed to time all fourteen of the flip-flops 66 and the logic gate circuits 56 to enable appropriate operations of the synchronous digital circuit 33.

The clock gating tree may be designed using a design abstraction, such as register-transfer-level (RTL), to create high-level representations of a circuit. As an example, the clock gating tree 50 can be designed using RTL as follows:

```
always@(posedge CLK or negedge RST_N)
begin
    if(!RST_N)
        BGBA_COL <= #15'd0;
    else
        if(act_det)
            BGBA_COL <= #1 CA[10:6];
end
```

Figure 3A:
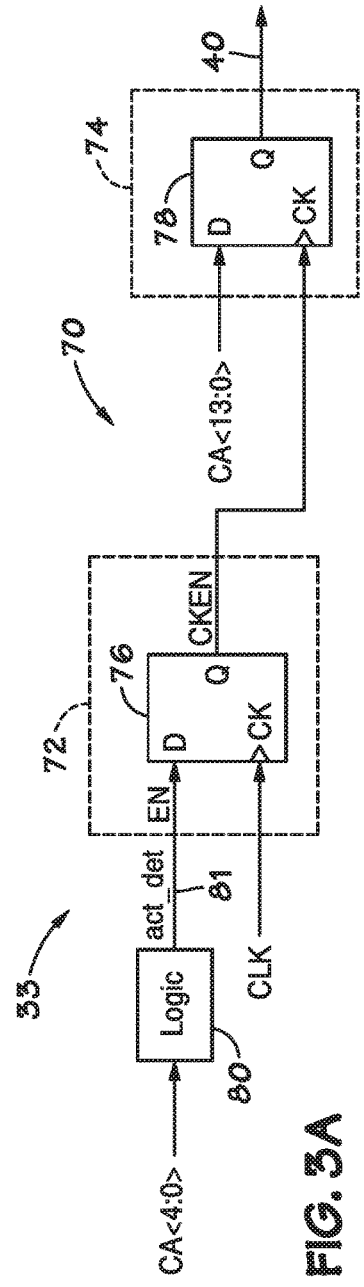
FIG. 3A is another example block diagram of a synchronous digital circuit in a command decoder of the memory device of FIG. 1, illustrating a clock gating tree, according to an embodiment of the present disclosure.
Figure 3B:
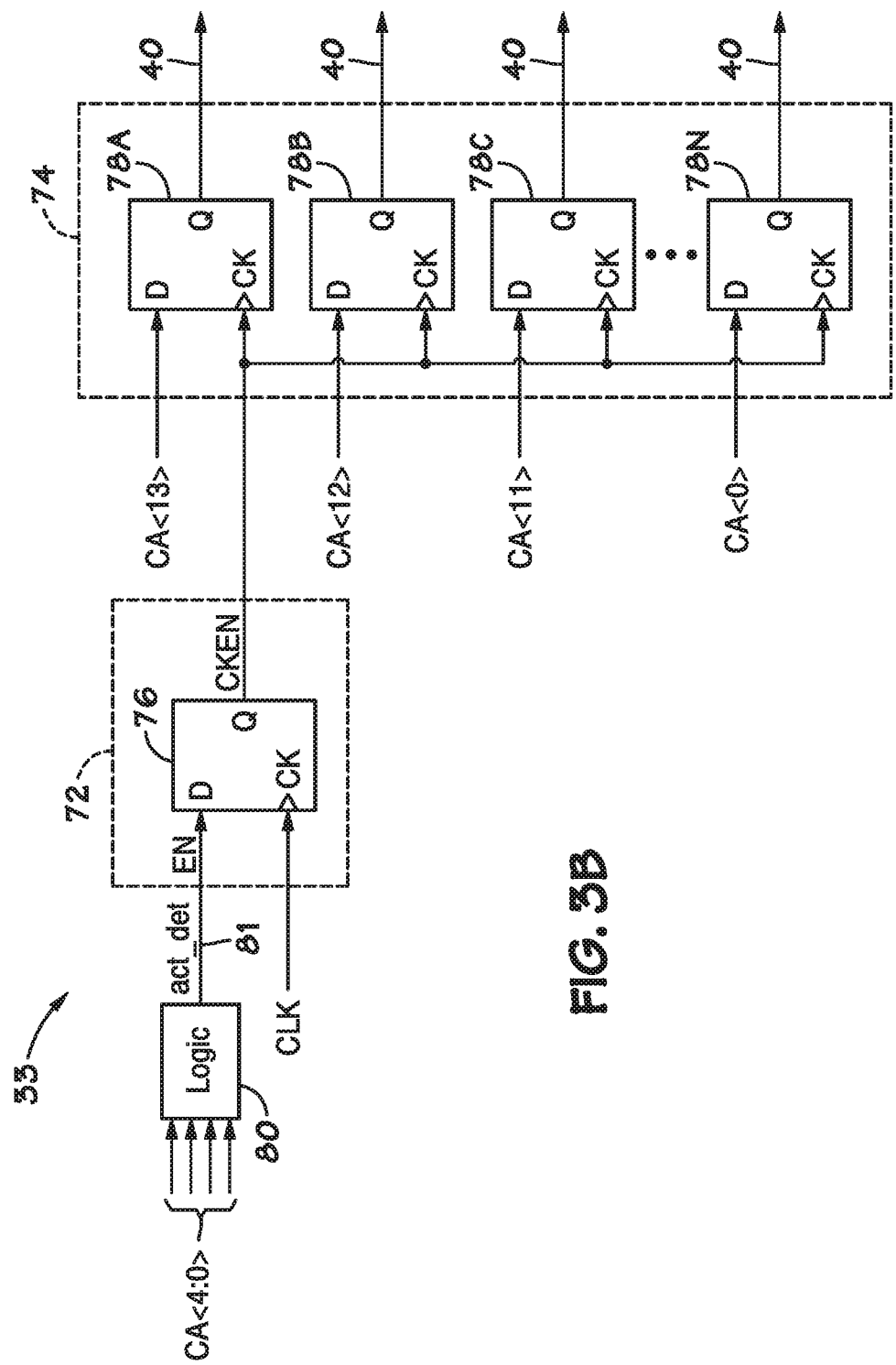
FIG. 3B is a more detailed representation of the clock gating tree of FIG. 3A, according to an embodiment of the present disclosure.

FIG. 3A is another example block diagram of the synchronous digital circuit 33 in a simplified representation. The synchronous digital circuit 33 may include a clock gating tree 70 for command signal clock gating. The clock gating tree 70 may include a first clock gating stage 72 and a second clock gating stage 74. The first clock gating stage 72 may include a flip-flop 76 that may include an input pin D, an output pin Q, and a clock pin CK. The second clock gating stage 74 may include fourteen flip-flops 78. Each of the fourteen flip-flops 78 may include an input pin D, an output pin Q, and a clock pin CK. A more detailed representation of the clock gating tree 70 is shown in FIG. 3B. As illustrated, the second clock gating stage 74 includes fourteen flip-flops 78A, 78B, 78C . . . , and 78N (collectively, "flip-flop 78"), and each signal line in FIG. 3B represents a 1-bit bus.

The flip-flop 76 of the first clock gating stage 72 is clocked every clock cycle based on the internal clock signal (CLK). In response to receiving an activate detection signal 81 (e.g., act_det), the flip-flop 76 latches the signal from the input pin D to the output pin Q. The signal output from the output pin Q of the flip-flop 76 is received by the flip-flops 78 as a clock enabling signal (CKEN) to activate clocking of the fourteen flip-flops 78 only when the clock enable signal (CKEN) is received, rather than on every clock cycle. Subsequently, each of the flip-flops 78 may latch one of the fourteen command/address signals (e.g., CA<13:0>) from the corresponding input pin D to the output pin Q based on the clock signal. As illustrated, the flip-flop 78A may latch the command/address signal CA<13>, the flip-flop 78B may latch the command/address signal CA<12>, the flip-flop 78C may latch the command/address signal CA<11>, and so forth. As may be appreciated, the clock gating tree 70 may be designed to time the flip-flop 76 to enable appropriate operations of the synchronous digital circuit 33.

It should be noted that clocking events of the flip-flops 78 in the second clock gating stage 74 are only activated in response to receiving the activate detection signal 81 in the first clock gating stage 72, which triggers latching of the clock enable signal (CKEN) to output Q of the flip-flop 76 and to the clock pins CK of the flip-flops 78. In accordance to some embodiments, the first clock gating stage 72 may be connected to logic 80 that is configured to determine the activate detection signal 81 based on certain criteria or considerations. For example, the commend/address signals (e.g., CA<13:0>) may be sent to the synchronous digital circuit 33 on a two-cycle basis that a command portion (e.g., CA<4:0>) is included in the first clock cycle and an address portion (e.g., CA<13:5> is included in the second clock cycle. Alternatively, a portion of the address portion (e.g., CA<7:5>) may be sent along with the command portion on the first clock cycle. The logic 80 may analyze the command portion (e.g., CA<4:0>), and if the command portion corresponds to certain command types, such as read commands, write commands, mode-register set commands, activate commands, etc. that require access to the memory banks, the logic 80 may send the activate detection signal 81 that subsequently leads to activation of the clocking events in the second clocking stage 74. On the other hand, if the command portion corresponds to certain command types, such as no operation commands, power down entry commands, refresh commands, etc. that do not require accesses to the memory banks, the logic 80 may determine not to send the activate detection signal 81. Accordingly, the flip-flops 78 in the second clocking stage 72 are not clocked unless the activate detection signal 81 is received by the flip-flop 76. In other embodiments, the logic cell 80 may determine the activate detection signal 81 based on other suitable criteria or considerations.

It should be noted that the clock gating tree 70 in FIGS. 3A and 3B is different from the clock gating tree 50 in FIGS. 2A and 2B in several ways. First, the clock gating tree 70 includes a much simplified scheme that advantageously minimizes the number of elements in the design, as compared to the clock gating tree 50. In particular, in the clock gating tree 70, the first clock gating stage 72 only includes the flip-flop 76, whereas in the clock gating tree 50 (see FIG. 3B), the first clock gating stage 52 includes fourteen logic gate circuits 56 (e.g., 56A, 56B, 56C . . . , 56N) (see FIG. 2A) and each of the logic gate circuits 56 includes four logic gates (e.g., the invertor 58, AND gates 60 and 62, and the OR gate 64) (see FIG. 2B). Second, the present design of the clock gating tree 70 may reduce power consumption by reducing the number of clocking events. In particular, in the clock gating tree 70, the clocking of the fourteen flip-flops 78 in the second clock gating stage 74 does not occur on every clock cycle; instead, the flip-flops 78 are activated upon the detection of or in response to the activate detection signal 81. As a comparison, in the clock gating tree 50, the fourteen flip-flops 66 in the second clock gating stage 54 are clocked on every clock cycle, which may consume additional power. Third, the overall timing of the clock gating tree may be simplified by the embodiments of the design of the clock gating tree 70, based on a reduction in complexity and the arrangement of elements of the clock gating tree. For example, the clock gating tree 70 includes fewer clocked elements as compared to the clock gating tree 50 (see FIG. 3B in comparison to FIG. 2B). For example, the clock gating tree 70 may be designed to time the flip-flop 76 to enable appropriate operations of the synchronous digital circuit 33, whereas the clock gating tree 50 may be designed to time all fourteen flip-flops 66.

As an example, the clock gating tree 70 can be designed using RTL as follows:

```
Wrap_ckgr xwrap_ckg_clk_c1_bgbacol(.cken(clk_act),
.en(act_det), .ck(CLK), .rf(RST_N));
always@(posedge clk_act or negedge RST_N)
  begin
    if(!RST)N)
      BGBA_COL <= #1 5'd0;
    else
      if(act_det)
        BGBA_COL <= #1 CA[10:6];
  end
```

Figure 4:
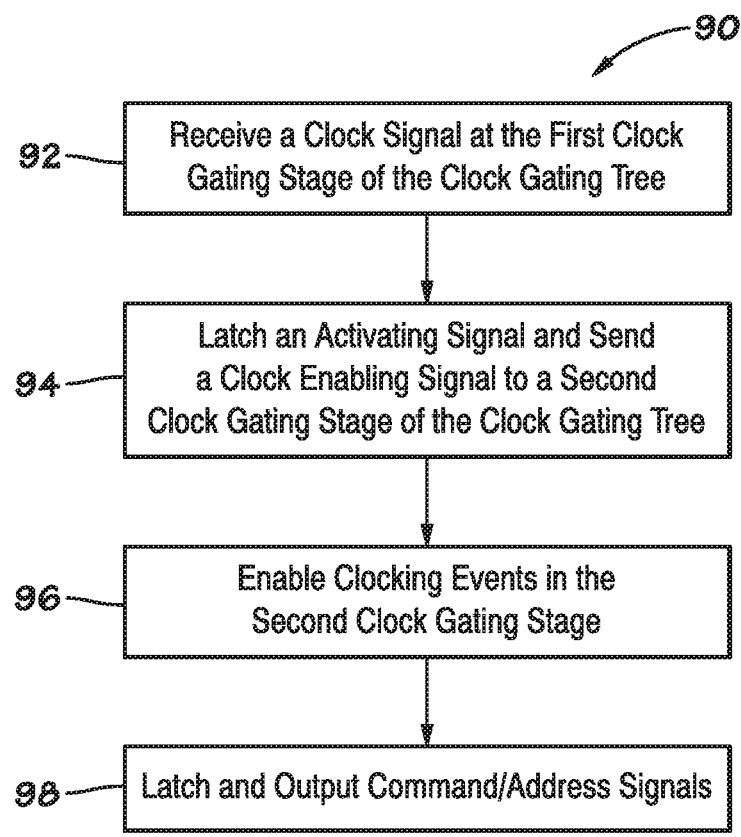
FIG. 4 is a flow diagram of a method for clock gating command signals received and output by the command decoder of FIG. 1, according to an embodiment of the present disclosure.

FIG. 4 is a flow diagram of a method 90 for clock gating command/address signals received and output by the command decoder 32 of FIG. 1. While the method 90 is described using steps in a specific sequence, it should be understood that the present disclosure contemplates that the described steps may be performed in different sequences than the sequence illustrated, and certain described steps may be skipped or not performed altogether in other embodiments. In some embodiments, at least some of the steps of the method 90 may be implemented in the synchronous digital circuit 33 of the command decoder 32. However, it should be understood that the method 90 may be implemented in any suitable device or combination of devices that are contemplated to perform the method 90.

As illustrated, the clock gating tree 70 receives a clock signal (CLK) in the first clock gating stage (process block 92). In response to receiving the clock signal (CLK) and upon receipt of an activating signal, such as the activate detection signal 81, the flip-flop 76 may latch the activating signal and output or send a clock enabling signal (CKEN) to enable clocking of the flip-flops 78 in the second clock gating stage 74 (process block 94). It should be noted that although in the illustrated embodiment (FIGS. 3A and 3B), the activate detection signal 81 (e.g., act_det) is illustrated as the activating signal, in other embodiments, the activating signal may include any other suitable activating signals or commands. In response to receiving the clock enabling signal (CKEN), clocking of the flip-flops 78 are enabled/activated (process block 96). Based on the clock signals, the flip-flops 78 may latch and output the command signals (e.g., CA<13:0>) (process block 98). It should be noted that as set forth above, the activating signal is determined by the logic 80. In the absence of the activating signal, no clock enabling signal (CKEN) is received to activate the clocking of the flip-flops 78 and the processes onwards, thereby reducing power consumption that would result if the flip-flops 78 were latched on every clock cycle.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A semiconductor device, comprising:
   a synchronous digital circuit configured to receive command address signals, wherein the synchronous digital circuit comprises a clock gating tree, comprising:
     a first clock gating stage comprising a first flip-flop configured to be latched based on a clock signal; and
     a second clock gating stage comprising a plurality of second flip-flops, wherein the plurality of second flip-flops are configured to be latched in response to an activate detection signal latched by the first flip-flop based on the clock signal,
   wherein the semiconductor device comprises a double data rate type five synchronous dynamic random access memory (DDR5 SDRAM) device.

2. The semiconductor device of claim 1, comprising logic coupled to the first clock gating stage and configured to provide the activate detection signal to an input of the first flip-flop.

3. The semiconductor device of claim 2, wherein the logic provides the activate detection signal based on command address signals received from a device external to the semiconductor device.

4. A semiconductor device, comprising:
   a synchronous digital circuit configured to receive command address signals, wherein the synchronous digital circuit comprises a clock gating tree, comprising:
     a first clock gating stage comprising a first flip-flop configured to be latched based on a clock signal; and
     a second clock gating stage comprising a plurality of second flip-flops, wherein the plurality of second flip-flops are configured to be latched in response to an activate detection signal latched by the first flip-flop based on the clock signal, wherein each of the command address signals comprises a two-cycle command.

5. The semiconductor device of claim 1, wherein the plurality of second flip-flops are not clocked on every clock cycle of the clock signal.

6. The semiconductor device of claim 1, wherein in response to the activate detection signal, the plurality of second flip-flops are configured to be clocked to latch the command address signals to one or more bank control blocks of one or more memory banks.

* * * * *